US011223338B2

(12) United States Patent
Podzemny

(10) Patent No.: US 11,223,338 B2
(45) Date of Patent: Jan. 11, 2022

(54) METHOD OF FORMING A SEMICONDUCTOR DEVICE AND CIRCUIT

(71) Applicant: SEMICONDUCTOR COMPONENTS INDUSTRIES, LLC, Phoenix, AZ (US)

(72) Inventor: Martin Podzemny, Lesna (CZ)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 120 days.

(21) Appl. No.: 16/814,129

(22) Filed: Mar. 10, 2020

(65) Prior Publication Data

US 2021/0288622 A1    Sep. 16, 2021

(51) Int. Cl.
*H03F 3/04* (2006.01)
*H03F 3/45* (2006.01)
*H03F 1/02* (2006.01)

(52) U.S. Cl.
CPC ....... *H03F 3/45179* (2013.01); *H03F 1/0211* (2013.01); *H03F 2203/45318* (2013.01); *H03F 2203/45528* (2013.01)

(58) Field of Classification Search
CPC ............. H03F 1/0211; H03F 3/04; H03L 5/00
USPC ................................ 327/333; 330/297, 290
See application file for complete search history.

(56) References Cited

U.S. PATENT DOCUMENTS 6,377,105 B1 * 4/2002 Hughes ............ H03K 19/00315
                                                    327/333
7,679,418 B2 * 3/2010 Vlasenko .............. H03L 7/0816
                                                    327/333

OTHER PUBLICATIONS

Ivan Padilla-Cantoya et al., "Class AB Low-Voltage CMOS Voltage Follower," 1-4244-1176-9/07/2007, IEEE, pp. 887-890.
Huijsing J. (2011) Output Stages. In: Operational Amplifiers. Springer, Dordrecht, pp. 118-121, 412-413.

* cited by examiner

*Primary Examiner* — Steven J Mottola
(74) *Attorney, Agent, or Firm* — Robert F. Hightower

(57) ABSTRACT

In one embodiment, an amplifier circuit may be configured with an output transistor that forms an output current and an output voltage at an output. The amplifier circuit may also include a reference circuit that may be configured to form a reference current that is substantially proportional to the output current. An embodiment of the reference circuit may also be configured to control a transistor to sink current from the output in response changes in the reference current.

20 Claims, 3 Drawing Sheets

METHOD OF FORMING A SEMICONDUCTOR DEVICE AND CIRCUIT

BACKGROUND

The present invention relates, in general, to electronics, and more particularly, to semiconductors, structures thereof, and methods of forming semiconductor devices.

In the past, various methods and structures were used to form amplifier circuits. In some configurations, the output signal of the amplifier had a low value that was much greater than the value of the common return voltage, such as for example greater than a ground value. This could cause improper operation of the load circuit that received the output signal. Additionally, the high value of the output signal generally had a value that was similar to the value of the input voltage. Some applications had a load that operated from a different voltage. Thus, the different voltage could cause improper operation of the load.

Accordingly, it is desirable to have a device that has an output signal with a high value that is a different value from a high value of the input signal, and/or that has a low value close to the value of the voltage return.

Figure 1:
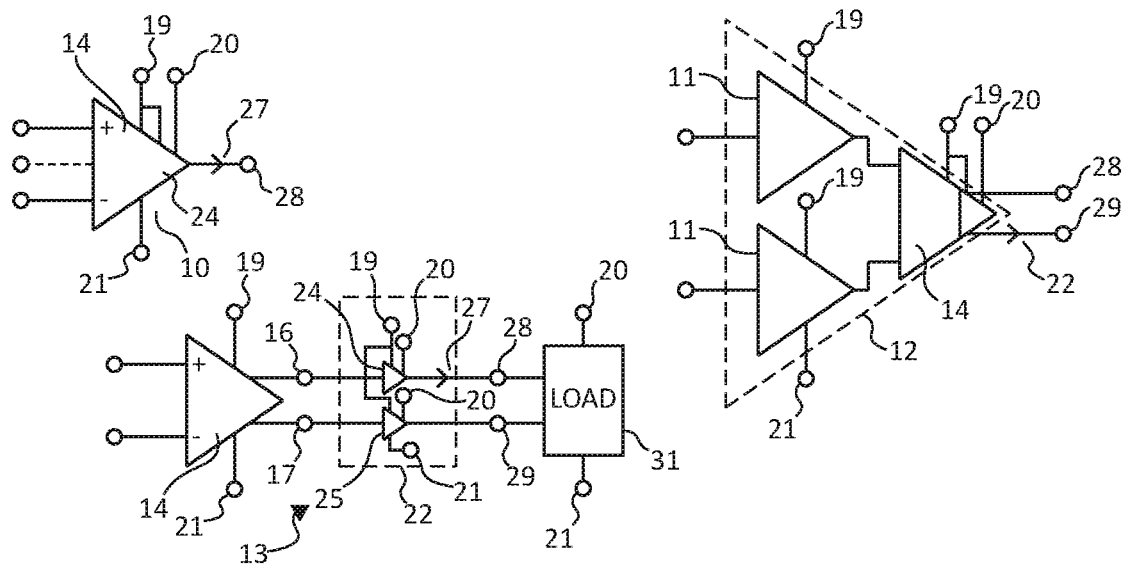
FIG. 1 schematically illustrates three examples of embodiments of portions of amplifier circuits in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DETAILED DESCRIPTION

FIG. 1 schematically illustrates three examples of embodiments of portions of amplifier circuits that include a translator circuit that forms an output signal from a different supply than the remainder of the amplifier circuit. A circuit 13 schematically illustrates an example of an embodiment of a portion of a differential amplifier that forms a differential output signal between outputs 28 and 29. Circuit 13 includes an amplifier circuit 14 that amplifies a differential input signal and operates from a first operating voltage ($V_1$) 19. Circuit 13 also includes a translator circuit 22 that operates from a second operating voltage ($V_2$) on an input 20 and forms the differential output signal referenced between voltage $V_2$ and a common return voltage of circuit 13 on return 21. In an embodiment, the second operating voltage is less than the first operating voltage. Circuit 22 includes two single ended output circuits or translator circuits 24 and 25. Each of circuits 24 and 25 receive an output from amplifier 14 and form an output signal that operates from voltage $V_2$. Each of circuits 24 and 25 provide an output voltage and an output current 27 to a load circuit or load 31.

A circuit 10 schematically illustrates an example of an embodiment of a portion of a differential amplifier circuit that forms a single ended output signal. Circuit 10 includes amplifier circuit 14 forms a single ended output signal. Circuit 10 also includes translator circuit 24, or alternately circuit 25, of circuit 22.

A circuit 12 schematically illustrates an example of an embodiment of a portion of a differential amplifier circuit that receives the differential input signal and forms a differential output signal. The input of circuit 12 may be formed from two different single ended differential amplifiers 11 that each have a single ended output that is provided to differential amplifier 14. Amplifier 14 includes circuit 22. Any one of circuits 10, 12, or 13 may include a feedback loop or circuit 23 as illustrated in FIG. 2.

Figure 2:
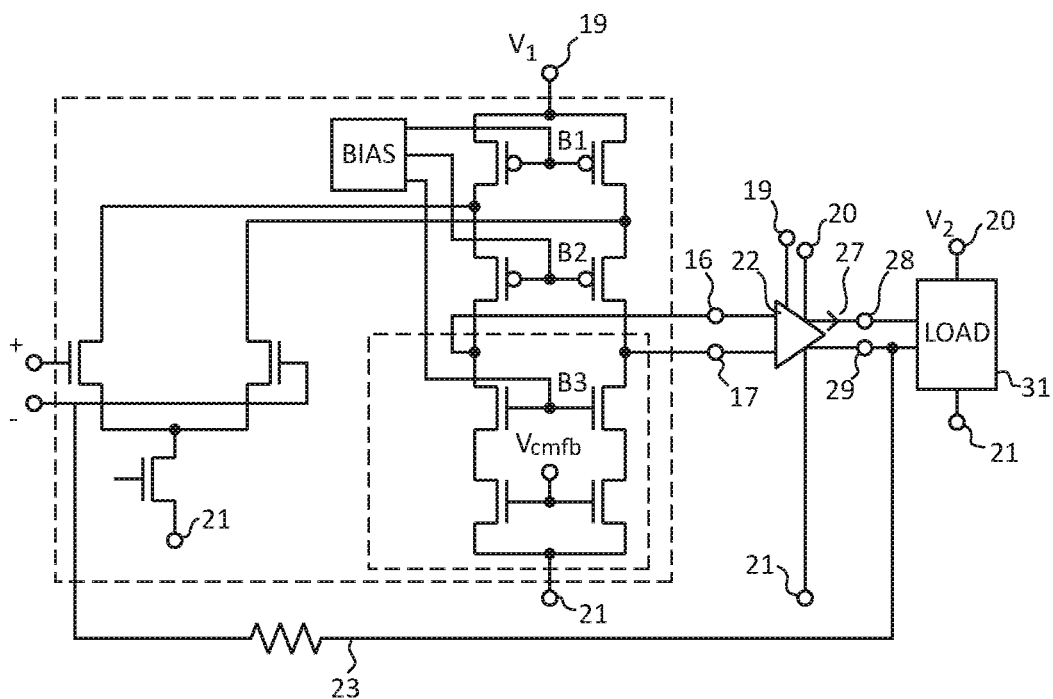
FIG. 2 schematically illustrates an example of an embodiment of a portion of an amplifier circuit that may be an alternate embodiment of any one of the circuits of FIG. 1 in accordance with the present invention.

FIG. 2 schematically illustrates an example of an embodiment of a portion of an amplifier circuit 26 that may have an embodiment that may be an alternate embodiment of any one of circuits 10, 12, or 13. Circuit 26 has a differential input amplifier 30 which receives an input signal between different inputs and provides a differential output between outputs 16 and 17. Amplifier 30 may be an alternate embodiment of any one of amplifiers 14 or 11 of FIG. 1. Circuit 26 includes output circuit 22. In an embodiment, amplifier 30 could be a single ended amplifier. For example, the inverting input could be connected to a substantially constant reference voltage as illustrated by dashed lines.

Those skilled in the art will appreciate that circuit 26 may include a feedback loop, such as for example a circuit 23, so that circuit 26 may be a portion of an operational amplifier having a certain gain.

Figure 3:
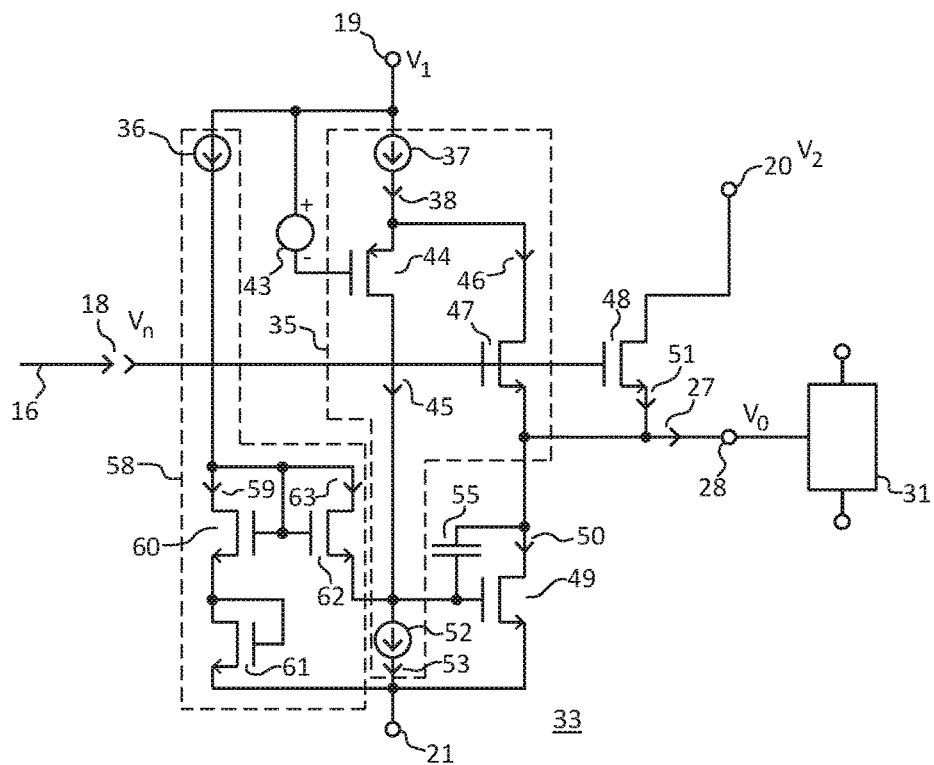
FIG. 3 schematically illustrates an example of an embodiment of a portion of a translator circuit or output circuit that may be an alternate embodiment of either of the circuits of FIGS. 1-2 in accordance with the present invention.

FIG. 3 schematically illustrates an example of an embodiment of a portion of a translator circuit or output circuit 33 that may have an embodiment that may be an alternate embodiment of either of or both of circuits 24 or 25 (FIG. 1) or portions of any of circuit 22. Circuit 33 may be one output circuit that may be connected to an output of a differential amplifier to form an output voltage ($V_O$) in response to the input voltage ($V_N$) received on input 18. For example, circuit 33 may be one of circuits 24 or 25 of FIG. 1. Circuit 33 receives the first operating voltage ($V_1$) for operating portions of circuit 33. Circuit 33 also receives the second operating voltage ($V_2$) for forming the output voltage $V_O$. In an embodiment, circuit 33 may be configured to form the output voltage ($V_O$) to have a maximum value that is no greater than (or alternately less than) the voltage $V_2$, thus, less than the voltage $V_1$ on input 19. An embodiment of circuit 33 includes a translator circuit that operates from the voltage $V_2$ on input 20 and forms the output voltage ($V_O$) to be representative of the input voltage ($V_N$) but at a lower voltage than the input voltage. Circuit 33 also supplies output current 27 to a load such as load 31. In an embodiment, load 31 may operate from the second operating voltage ($V_2$) on input 20, but could operate from other voltages in other embodiments. For example, operate from a voltage that is greater than the second operating voltage ($V_2$) but less than the first operating voltage ($V_1$).

Circuit 33 includes an output transistor that forms voltage $V_O$, a gain circuit, and a reference circuit 35 that operates from $V_1$ received on input 19. In an embodiment, the output transistor may be a transistor 48 configured as a voltage follower to form voltage $V_O$ from $V_2$. An embodiment of reference circuit 35 may be configured to form a reference current 46 that is representative of a current 51 through transistor 48. An embodiment may include that circuit 33 may be configured to control the gain circuit to sink current from output 28, or alternately from load 31, in response to the reference current or alternately to a change in the reference current. In an embodiment, the gain circuit may sink current from load 31 in response to an increased value of voltage $V_O$. An embodiment may include that the gain circuit may be a gain transistor 49.

Circuit 35 may have an embodiment that may include a reference transistor 47, a current source 37 that forms a current 38, a transistor 44, and a second current source 52 that forms a current 53. As will be seen further hereinafter, circuit 33 may also include an optional response circuit 58, and an optional compensation capacitor 55.

Sources 37 and 52 are formed such that, under the condition that no load is attached to output 28, the values of respective currents 38 and 53 are:

I38=I46+I53, which causes I45=I53 where:

I38=the value of current 38,
I46=the value of current 46,
I45=the value of current 45, and
I53=the value of current 53.

Assume that circuit 33 is operating and receiving an input voltage of ($V_N$) on input 18 to supply $V_O$ and current 27 to load 31 through output 28. Transistor 47 receives $V_N$, or a signal representative of $V_N$, and forms reference current 46 to flow through transistor 47. Transistor 48 also receives $V_N$, or the signal representative of $V_N$, and forms current 51 flowing through transistor 48 to output 28 as current 27. In the preferred embodiment, the active area of transistor 48 is formed to be proportional to the active area of transistor 47 by a value K such that the area of transistor 48 is substantially K times the area of transistor 47. Thus, current 51 is proportional to current 46 by the value K, for example K times current 46. Thus, current 46 is substantially a mirror image of current 51. Current 38 from current source 37 divides so that a portion of current 38 flows as current 46 through transistor 47 and a different portion of current 38 flows through transistor 44 as current 45. Current 45 flows to current source 52 and affects the gate voltage, thus $V_{GS}$, of transistor 49. As the value of current 45 decreases, the voltage supplied to the gate of transistor 49 also decreases, and as current 45 increases the gate voltage of transistor 49 also increases. As transistor 48 is supplying current 27, transistor 47 is conducting current 46, which is proportional to current 27, and transistor 49 is conducting current 50 through transistor 49 which would be substantially equal to current 46.

An embodiment may include that transistor 48 is configured in a voltage follower configuration, thus, voltage $V_O$ is substantially $V_N$ shifted by the $V_{GS}$ of transistor 48. Since transistor 48 operates from V$_2$, the maximum value of V$_O$ is no greater than V$_2$ which is less than V$_1$, thus less than the maximum value of V$_N$. Using an NMOS transistor for transistor 48 facilitates forming V$_O$ to follow V$_N$.

If V$_N$ decreases relative to V$_O$, or alternately V$_O$ increases relative to V$_N$, the V$_{GS}$ of transistors 47 and 48 will decrease causing currents 46 and 27 to decrease. Decreasing current 46 increases current 45 which will also increase the V$_{GS}$ of transistor 49 so that current 50 becomes greater than current 46. Thus, transistor 49 will be sinking current from load 31 in addition to current 46. Thus, at least a portion of current 27 will flow into circuit 33, or alternately through transistor 49. If V$_N$ increases relative to V$_O$, or alternately V$_O$ decreases relative to V$_N$, the V$_{GS}$ of transistors 47 and 48 will increase and cause currents 46 and 27 to increase. Increasing current 46 decreases current 45 which decreases the V$_{GS}$ of transistor 49 which decreases current 50.

Using an NMOS transistor for transistor 49 facilitates circuit 33 forming the lowest value of V$_O$ to be very near to the return voltage on return 21.

An embodiment of circuit 33 may include circuit 58. In some cases, the value of current 27, thus current 46, may increase such that the value of current 45 becomes much less than current 53. Without optional circuit 58, current 45 could possibly be small enough such that transistor 49 may cease to conduct. Optional circuit 58 may be configured to assist forming the V$_{GS}$ of transistor 49 at a value that prevents transistor 49 from operating in the cut-off mode. If transistor 49 were to go into cut-off, it would take a finite time for transistor 49 to recover from cut-off and to begin conducting current 50. Thus, circuit 58 may form the gate voltage of transistor 49 to be a value that substantially prevents operating in the cut-off mode. In an embodiment, circuit 58 may form the V$_{GS}$ of transistor 49, at a value that is no less than the V$_{GS}$ threshold value of transistor 49. The V$_{GS}$ threshold value is the value at which a channel begins to form and transistor 49 may begin to conduct some small amount of current.

Optional circuit 58 includes a current source 36, a transistor 60, a transistor 61, and a transistor 62 that is connected in a current mirror configuration with transistor 60. Transistor 62 also sets the voltage applied to the gate of transistor 49. The V$_{GS}$ voltage applied to transistor 49 may be expressed as:

$$VGS49 = VGS61 + VGS60 - VGS62$$

Where:
VGS49=the V$_{GS}$ applied to transistor 49,
VGS61=the V$_{GS}$ of transistor 61,
VGS60=the V$_{GS}$ of transistor 60, and
VGS62=the V$_{GS}$ of transistor 62.

Transistor 61 is connected in a diode configuration which causes transistor 60 to conductor a current 59 through transistor 60. The current mirror configuration of transistors 60 and 62 forms a current 63 to flow to current source 52 so that some current flows into source 52. This keeps the V$_{GS}$ of transistor 49 to be substantially no less than the threshold V$_{GS}$ value for transistor 49.

An embodiment of circuit 33 may also include an optional frequency compensation capacitor 55 that is connected between the gate and drain of transistor 49. Connecting capacitor 55 between the gate and drain allows using a smaller value of capacitor to form an equivalent capacitor having a value that is increase by the gain provided by transistor 49.

In order to assist in providing the hereinbefore described functionality for circuit 33, a first terminal of source 37 is commonly connected to input 19 and to a first terminal of source 40. A second terminal of source 40 is commonly connected to input 20 and to a drain of transistor 48. A source of transistor 48 is commonly connected to output 28, a source of transistor 47, and a drain of transistor 49. A source of transistor 49 is commonly connected to return 21 and to a first terminal of source 52. A second terminal of source 52 is commonly connected to the gate of transistor 49 and to a drain of transistor 44. A source of transistor 44 is commonly connected to a second terminal of source 37 and to a drain of transistor 47. A gate of transistor 47 is commonly connected to the gate of transistor 48 and to receive the input voltage (V$_N$). A gate of transistor 44 is connected to a first terminal of an offset voltage circuit 43 which has a second terminal connected to input 19.

In order to additionally assist in providing the hereinbefore described functionality for circuit 33, optional circuit 58 may include a current source 36 having a first terminal connected to input 19. A second terminal of current source 36 is commonly connected to a drain of transistor 60, a gate of transistor 60, a gate of transistor 62, and a drain of transistor 62. A source of transistor 62 is connected to the gate of transistor 49. A source of transistor 60 is commonly connected to a drain of transistor 61 and a gate of transistor 61. A source of transistor 61 is connected to the source of transistor 49. Optional capacitor 55 may have a first terminal connected to a drain of transistor 49 and a second terminal connected to the gate of transistor 49.

Figure 4:
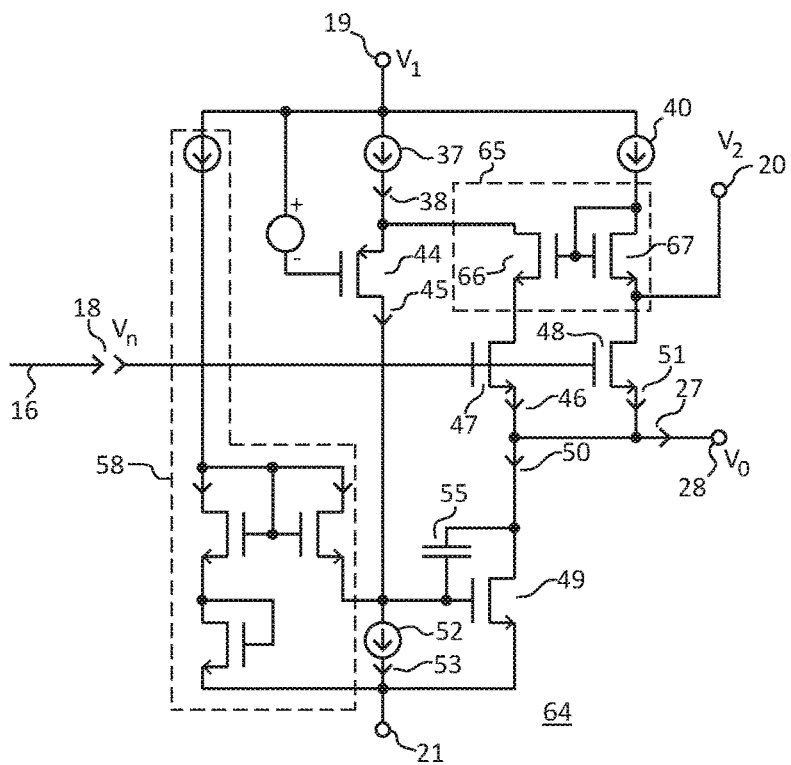
FIG. 4 schematically illustrates an embodiment of a portion of a circuit that may be an alternate embodiment of the circuit of FIG. 3 in accordance with the present invention.

FIG. 4 schematically illustrates an embodiment of a portion of a circuit 64 that may have an embodiment that may be an alternate embodiment of circuit 33 (FIG. 3). Circuit 64 is substantially similar to circuit 33 except that the reference circuit includes an accuracy circuit 65 that is inserted between transistor 48 and input 20, and between transistor 47 and source 37. Circuit 65 may be utilized to improve the matching between currents 46 and 51.

In an embodiment, the active area of transistors 47 and 48 may be formed to have a long width and a very small length in order to form a low output resistance for transistor 48. However, the ratio or K relationship between the active areas of transistors 47 and 48 is affected by the drain voltages of transistors 47 and 48. The current mirror connections of transistor 66 and 67 assists in forming the drain voltage of transistor 47 to be substantially the same as the drain voltage of transistor 48. Forming this relationship assists in forming the relationship K between the active areas to less dependency on the drain voltage and thus to be a more precise relationship.

In order to assist in providing the hereinbefore described functionality for circuit 64, a drain of transistor 67 may be commonly connected to the second terminal of source 40, to a gate of transistor 67, and to a gate of transistor 66. A source of transistor 67 may be commonly connected to input 20 and to the drain of transistor 48. A source of transistor 66 may be connected to a drain of transistor 47, and a drain of transistor 66 may be connected to the source of transistor 44.

Figure 5:
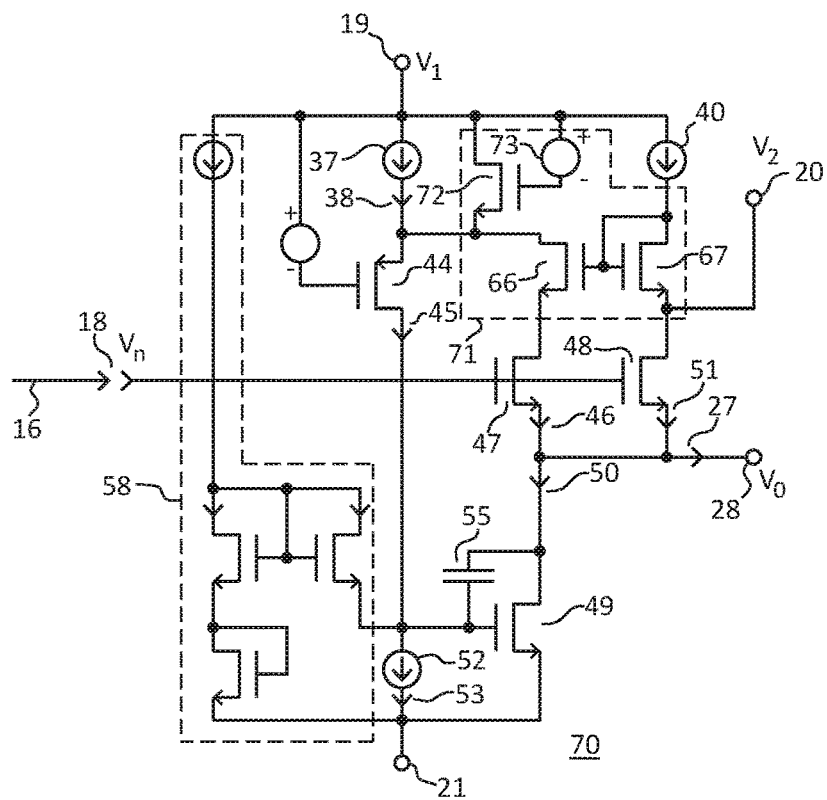
FIG. 5 schematically illustrates an embodiment of a portion of a circuit that may be an alternate embodiment of the circuit of FIG. 3 or FIG. 4 in accordance with the present invention.

FIG. 5 schematically illustrates an embodiment of a portion of a circuit 70 that may have an embodiment that may be an alternate embodiment of circuit 64 (FIG. 4). Circuit 70 is substantially similar to circuit 64 except that the reference circuit includes an accuracy circuit 71 that is an alternate embodiment of circuit 65 (FIG. 4). Circuit 71 includes a transistor 72 and a voltage offset circuit 73. In the case that current 46 increases to a value near to current 38, transistor 72 assists in supplying current to assists in forming current 46. In an embodiment, transistor 72 assists in keeping the drain voltage of transistor 66 to a value that is approximately the gate voltage of transistor 72 minus the $V_{GS}$ of transistor 72. An embodiment may include that if current 46 is greater than current 38, the drain voltage of transistor 66 is V1-V73-Vgs72 (where V73 is the voltage provided by circuit 73, and Vgs72 is the gate-to-source voltage of transistor 73). In the case that current 46 is less than current 38, transistor 72 assists in keeping the drain of transistor 66 at a value greater than the gate of transistor 72 plus the threshold voltage of transistor 72. An embodiment may include that if current 46 is less than current 38, transistor 72 is cut-off (for example, the gate voltage of transistor 44 minus the Vgs of transistor 44 is greater than the gate voltage of transistor 72 minus the Vgs of transistor 72). In an embodiment, the bias voltages provided by circuits 23 and 38 may be selected to assist in providing this condition. Thus, transistor 72 assists in providing an improved response time for circuit 70.

Figure 6:
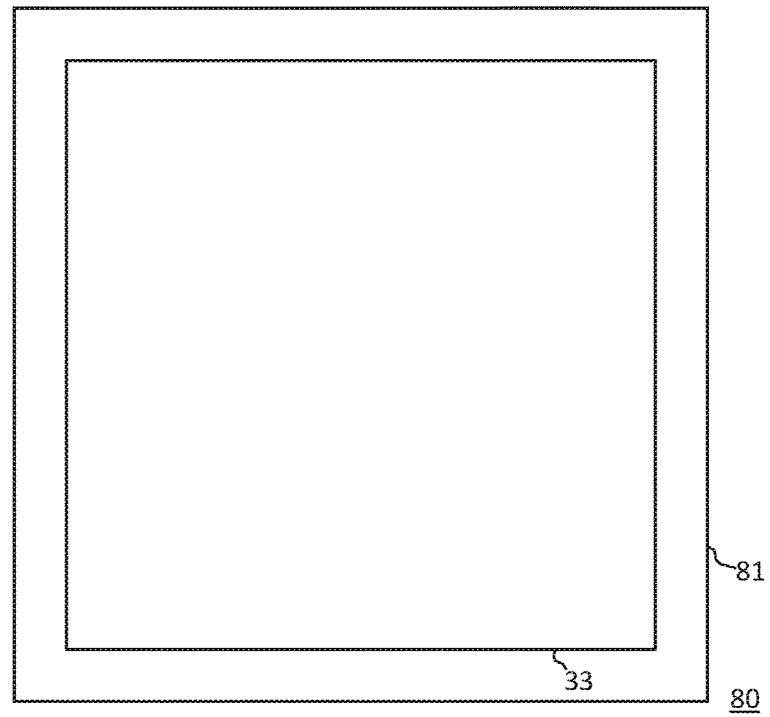
FIG. 6 illustrates an enlarged plan view of a semiconductor device that includes some of the circuits of at least one of FIGS. 1-4 in accordance with the present invention.

FIG. 6 illustrates an enlarged plan view of a portion of an embodiment of a semiconductor device or integrated circuit 80 that is formed on a semiconductor die 81. In an embodiment, any one of circuits 10, 12, 13, 26, 31, 33, or 34 may be formed on die 81. Die 81 may also include other circuits that are not shown in FIG. 5 for simplicity of the drawing.

From all the foregoing, one skilled in the art will appreciated that an output circuit may comprise:

a voltage follower transistor, such as for example transistor 48, configured to receive a first signal that is representative of an input voltage, such as for example voltage 16, formed from a first voltage supply, such as for example 19, the voltage follower transistor configured to form an output voltage, such as for example voltage $V_O$, from a second supply voltage, such as for example voltage 20, that is less than the first voltage supply and to supply an output current, such as for example current 27, at an output, such as for example output 28, to a load, such as for example load 31;

a gain transistor, such as for example transistor 49, configured to sink current from the output in response to an increase in the output voltage, the gain transistor having a control electrode; and a reference circuit, such as for example circuit 35, coupled to the control electrode of the gain transistor and configured to increase a first voltage supplied to the control electrode of the gain transistor in response to the increase in the output voltage, the reference circuit having a reference transistor that conducts a reference current, such as for example current 46.

An embodiment may include that the reference circuit may be configured to decrease the first voltage in response to a decrease in the output voltage.

In an embodiment, the voltage follower transistor may have a drain coupled to receive the second supply voltage, a source coupled to source the output current, and a gate.

The output circuit may have an embodiment wherein the reference transistor may have a control electrode coupled to receive the first signal and conducted the reference current, wherein the reference current varies in response to variations of the output voltage.

An embodiment may include that the reference circuit may vary the first voltage supplied to the control electrode of the gain transistor in response to changes in the reference current.

In an embodiment, a gate of the voltage follower transistor is commonly coupled to a gate of the reference transistor and to receive the input voltage.

An embodiment may include that the voltage follower transistor may have a source coupled to a source of the gain transistor and coupled to supply the output voltage.

In an embodiment, the reference circuit may form a first current, such as for example current 38, the reference transistor configured to conduct a first portion of the first current as the reference current; and the reference circuit including a first transistor, such as for example transistor 44, that conducts a second portion, such as for example portion 45, of the reference current as a second current, such as for example current 45, and changes the first voltage supplied to the control electrode of the gain transistor proportionally to changes in the second current.

An embodiment may include that the reference circuit may have a first current source, such as for example 52, coupled to the control electrode of the gain transistor wherein the first current source conducts the second current.

In an embodiment, the reference circuit may include a second current source, such as for example source 37, having a first terminal coupled to receive the first voltage supply and a second terminal coupled to supply the first current.

Another embodiment may further include that a response circuit, such as for example circuit 58, may be configured to limit the first voltage to a value no less than substantially a gate threshold voltage of the gain transistor.

In an embodiment, a response circuit, such as for example circuit 58, may have a first transistor, such as for example transistor 61, with a source coupled to a source of the gain transistor, the first transistor having a gate coupled to a drain of the first transistor and to a source of a second transistor, such as for example transistor 60, the second transistor having a gate commonly coupled to a drain of the second transistor and to a gate of a third transistor and to a drain of the third transistor, the third transistor having a source coupled to the gate of the gain transistor.

An embodiment may include an accuracy circuit, such as for example circuit 65, configured to limit a drain voltage of the voltage follower transistor to substantially a drain voltage of a reference transistor of the reference circuit.

In an embodiment, the accuracy circuit may include a first accuracy transistor, such as for example transistor 67, having a source commonly coupled to a drain of the voltage follower transistor and to receive the second supply voltage, the first accuracy transistor having a gate coupled to a drain of the first accuracy transistor, the accuracy circuit including a second accuracy transistor, such as for example 66, having a gate coupled to the gate of the first accuracy transistor, a source coupled to a drain of the reference transistor, and a drain coupled to conduct the reference current.

Those skilled in the art will also appreciate that a method of forming a translator circuit may comprise:

coupling a voltage follower transistor to receive a control signal from a first circuit that operates from a first operating voltage, the voltage follower transistor configured to form an output voltage from a second operating voltage that is less than the first operating voltage wherein the output voltage is representative of the control signal and is formed at an output and wherein the voltage follower transistor supplies an output current from the second operating voltage; and configuring a reference circuit to control an output transistor, such as for example transistor 49, to sink a current, such as for example current 50, at the output in response to a decrease in the output voltage.

The method may have an embodiment that may include forming the voltage follower transistor to decrease a value of the output current in response to the decrease of the output voltage.

An embodiment may also include configuring the reference circuit to form a reference current that is substantially proportional to the output current and control the output transistor according to the reference current.

Those skilled in the art will appreciate that an embodiment of a method of forming a semiconductor device may comprise:

configuring an amplifier circuit of the semiconductor device to operate from a first operating voltage and form a first signal referenced to the first operating voltage;

configuring an output transistor of the semiconductor device to operate from a second operating voltage that is less than the first operating voltage, the output transistor configured to form an output voltage from the second operating voltage and to also form an output current through the output transistor wherein the output voltage is formed at an output and is representative of the first signal; and configuring a reference circuit to form a reference current that is substantially proportional to the output current, the reference circuit configured to control a first transistor, such as for example 49, to sink current from the output in response changes in the reference current.

The method may have an embodiment that may include configuring the reference circuit includes coupling a reference transistor to form the reference current wherein a gate of the reference transistor is connected to a gate of the output transistor, wherein changes in the reference current changes a gate voltage of the first transistor.

An embodiment may include configuring the reference circuit to control the first transistor to sink current from the output in response an increase in the output voltage.

In view of all of the above, it is evident that a novel device and method is disclosed. Included, among other features in an embodiment, is an NMOS voltage follower output transistor that receives an input voltage operating from a first voltage source and forms an output voltage operating from a lower voltage source. The voltage follower configuration facilitates using an NMOS transistor instead of a PMOS transistor. The voltage follower configuration also facilitates limiting the maximum value of the output voltage to less than the lower voltage source. Configuring a reference circuit to form a current that varies in response to variations of the load current facilitates controlling a gain transistor to sink current from the output to control the output voltage. The control loop of the reference circuit has a fast response which facilitates a fast response to changes in the output voltage or input voltage. Using an NMOS transistor for the gain transistor facilitates the output voltage having a lower value that is near the value of the common return voltage.

Using an optional response circuit assists in having a fast response time. Substantially keeping the gain transistor out of the cut-off mode assists in providing the fast response time.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. An output circuit comprising:
    a voltage follower transistor configured to receive a first signal that is representative of an input voltage formed from a first voltage supply, the voltage follower transistor configured to form an output voltage from a second supply voltage that is less than the first voltage supply and to supply an output current at an output to a load;
    a gain transistor configured to sink current from the output in response to an increase in the output voltage, the gain transistor having a control electrode; and
    a reference circuit coupled to the control electrode of the gain transistor and configured to increase a first voltage supplied to the control electrode of the gain transistor in response to the increase in the output voltage, the reference circuit having a reference transistor that conducts a reference current.

2. The output circuit of claim 1 wherein the reference circuit is configured to decrease the first voltage in response to a decrease in the output voltage.

3. The output circuit of claim 1 wherein the voltage follower transistor has a drain coupled to receive the second supply voltage, a source coupled to source the output current, and a gate.

4. The output circuit of claim 1 wherein the reference transistor has a control electrode coupled to receive the first signal and conducted the reference current, wherein the reference current varies in response to variations of the output voltage.

5. The output circuit of claim 4 wherein the reference circuit varies the first voltage supplied to the control electrode of the gain transistor in response to changes in the reference current.

6. The output circuit of claim 5 wherein a gate of the voltage follower transistor is commonly coupled to a gate of the reference transistor and to receive the input voltage.

7. The output circuit of claim 6 wherein the voltage follower transistor has a source coupled to a source of the gain transistor and coupled to supply the output voltage.

8. The output circuit of claim 1 wherein the reference circuit forms a first current, the reference transistor configured to conduct a first portion of the first current as the reference current; and
    the reference circuit including a first transistor that conducts a second portion of the reference current as a second current and changes the first voltage supplied to the control electrode of the gain transistor proportionally to changes in the second current.

9. The output circuit of claim 8 wherein the reference circuit includes a first current source coupled to the control electrode of the gain transistor wherein the first current source conducts the second current.

10. The output circuit of claim 9 wherein the reference circuit includes a second current source having a first terminal coupled to receive the first voltage supply and a second terminal coupled to supply the first current.

11. The output circuit of claim 1 further including a response circuit configured to limit the first voltage to a value no less than substantially a gate threshold voltage of the gain transistor.

12. The output circuit of claim 11 further including a response circuit having a first transistor with a source coupled to a source of the gain transistor, the first transistor having a gate coupled to a drain of the first transistor and to a source of a second transistor, the second transistor having a gate commonly coupled to a drain of the second transistor and to a gate of a third transistor and to a drain of the third transistor, the third transistor having a source coupled to the gate of the gain transistor.

13. The output circuit of claim 1 further including an accuracy circuit configured to limit a drain voltage of the voltage follower transistor to substantially a drain voltage of a reference transistor of the reference circuit.

14. The output circuit of claim 13 wherein the accuracy circuit includes a first accuracy transistor having a source commonly coupled to a drain of the voltage follower transistor and to receive the second supply voltage, the first accuracy transistor having a gate coupled to a drain of the first accuracy transistor, the accuracy circuit including a second accuracy transistor having a gate coupled to the gate of the first accuracy transistor, a source coupled to a drain of the reference transistor, and a drain coupled to conduct the reference current.

15. A method of forming a translator circuit comprising:
coupling a voltage follower transistor to receive a control signal from a first circuit that operates from a first operating voltage, the voltage follower transistor configured to form an output voltage from a second operating voltage that is less than the first operating voltage wherein the output voltage is representative of the control signal and is formed at an output and wherein the voltage follower transistor supplies an output current from the second operating voltage; and
configuring a reference circuit to receive the control signal and responsively form a reference current to control an output transistor to sink current from the output in response to a change in the control signal.

16. The method of claim 15 including forming the voltage follower transistor to decrease a value of the output current in response to the change in the control signal.

17. The method of claim 15 including configuring the reference circuit to form a reference current that is substantially proportional to the output current and control the output transistor according to the reference current.

18. A method of forming a semiconductor device comprising:
configuring an amplifier circuit of the semiconductor device to operate from a first operating voltage and form a first signal referenced to the first operating voltage;
configuring an output transistor of the semiconductor device to operate from a second operating voltage that is less than the first operating voltage, the output transistor configured to form an output voltage from the second operating voltage and to also form an output current through the output transistor wherein the output voltage is formed at an output and is representative of the first signal; and
configuring a reference circuit to form a reference current that is substantially proportional to the output current, the reference circuit configured to control a first transistor to sink current from the output in response to changes in the reference current.

19. The method of claim 18 wherein configuring the reference circuit includes coupling a reference transistor to form the reference current wherein a gate of the reference transistor is connected to a gate of the output transistor, wherein changes in the reference current changes a gate voltage of the first transistor.

20. The method of claim 15 including configuring the reference circuit to operate from a supply voltage that is greater than the second operating voltage.

* * * * *